(12) United States Patent
Kim et al.

(10) Patent No.: US 6,642,105 B2
(45) Date of Patent: Nov. 4, 2003

(54) SEMICONDUCTOR DEVICE HAVING MULTI-GATE INSULATING LAYERS AND METHODS OF FABRICATING THE SAME

(75) Inventors: Kyung-Hyun Kim, Seoul (KR); Chang-Ki Hong, Yongin-shi (KR); U-In Chung, Seoul (KR); Bum-Soo Kim, Yongin-shi (KR); Yoo-Cheol Shin, Kyunggi-do (KR); Kyu-Chan Park, Pyoungtaek-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/131,010

(22) Filed: Apr. 24, 2002

(65) Prior Publication Data

US 2002/0119615 A1 Aug. 29, 2002

Related U.S. Application Data

(62) Division of application No. 09/679,669, filed on Oct. 5, 2000.

(30) Foreign Application Priority Data

Dec. 24, 1999 (KR) .............................................. 99-61929

(51) Int. Cl.[7] .............................................. H01L 21/336
(52) U.S. Cl. ........................ 438/257; 438/275; 438/287
(58) Field of Search ................................ 438/257, 201, 438/211, 258, 261, 275, 287, 439, 981; 257/314, 315, 316, 317, 211

(56) References Cited

U.S. PATENT DOCUMENTS 4,866,002 A * 9/1989 Shizukuishi et al. ........ 438/217

* cited by examiner

Primary Examiner—Phat X. Cao
Assistant Examiner—Theresa T. Doan
(74) Attorney, Agent, or Firm—Mills & Onello LLP

(57) ABSTRACT

A semiconductor device having multi-gate insulating layers and methods of fabricating the same are provided. The semiconductor device includes an isolation region disposed at a predetermined region of a semiconductor substrate. The isolation region defines at least one first active region and at least one second active region. The first active region is covered with a first gate insulating layer, and the second active region is covered with a second gate insulating layer which is thinner than the first gate insulating layer. Preferably, the top surface of the first gate insulating layer has the same height as the that of the second gate insulating layer. The isolation region is filled with an isolation layer which preferably covers the entire sidewalls of the first and second gate insulating layers. A typical method includes the step of selectively forming a first gate insulating layer at a predetermined region of a semiconductor substrate. A second gate insulating layer which is thinner than the first insulating layer is selectively formed at the surface of the semiconductor substrate adjacent to the first gate insulating layer. Preferably, the bottom surface of the first gate insulating layer is lower than that of the second gate insulating layer. The first and second gate insulating layers are covered with a conductive layer. The conductive layer, the first and second gate insulating layers, and the substrate are etched to form an isolation region, for example, a trench region, defining a first active region under the first gate insulating layer and a second active region under the second gate insulating. An isolation layer is formed in the trench region. The isolation layer preferably covers the entire sidewalls of the first and second gate insulating layers.

6 Claims, 16 Drawing Sheets

US 6,642,105 B2

SEMICONDUCTOR DEVICE HAVING MULTI-GATE INSULATING LAYERS AND METHODS OF FABRICATING THE SAME

RELATED APPLICATIONS

This application is a divisional of copending U.S. application Ser. No. 09/679,669, filed on Oct. 5, 2000, the contents of which are incorporated herein in their entirety by reference.

FIELD OF THE INVENTION

This invention relates to a semiconductor device and methods of fabricating the same and, more particularly, to a semiconductor device having multi-gate insulating layers and methods of fabricating the same.

BACKGROUND OF THE INVENTION

Most semiconductor devices such as semiconductor memory devices or semiconductor logic devices use a plurality of MOS transistors in order to increase integration density and reduce power consumption. Generally, an oxide layer having a unique thickness is used as the gate insulating layers of all the MOS transistors in the semiconductor device. However, non-volatile memory devices such as electrically programmable read only memory (EPROM) devices, electrically erasable programmable read only memory (EEPROM) devices or flash memory devices require both low voltage MOS transistors operating in a read mode and high voltage MOS transistors operating in an erase or a program mode. Accordingly, at least two kinds of MOS transistors are formed in the non-volatile memory device.

Voltages applied to the high voltage MOS transistor are higher than those applied to the low voltage MOS transistor. Thus, the high voltage MOS transistor should be designed to be different from the low voltage MOS transistor. For example, the gate insulating layer of the high voltage MOS transistor should be thicker than that of the low voltage MOS transistor in order to achieve reliability at the high voltage. As a result, in such devices, it is required to form at least two kinds of gate insulating layers having different thickness from each other, i.e., multi-gate insulating layers, in order to fabricate the non-volatile memory device.

A method of fabricating a non-volatile memory device is taught in U.S. Pat. No. 5,723,355 entitled "Method to incorporate non-volatile memory and logic components into a single sub-0.3 micron fabrication process for embedded non-volatile memory," by Chang et al., which is hereby incorporated herein by reference. This method includes the step of sequentially forming a tunnel oxide layer of a cell transistor and a polysilicon layer for a floating gate on an entire surface of a semiconductor substrate. The polysilicon layer and the tunnel oxide layer are successively patterned to expose the substrate in a high voltage MOS transistor region and the substrate in a logic MOS transistor region. A gate insulating layer for the high voltage MOS transistor is formed at the surface of the exposed semiconductor substrate. The gate insulating layer in the logic MOS transistor region is selectively removed to expose the substrate in the logic MOS transistor region. A gate insulating layer for the logic MOS transistor is formed at the surface of the exposed substrate in the logic MOS transistor region.

According to the U.S. Pat. No. 5,723,355, the tunnel oxide layer in the cell transistor region can be prevented from being in direct contact with a first photoresist pattern exposing the high voltage transistor region and the logic transistor region. Thus, it is possible to prevent the tunnel oxide layer from being contaminated due to the first photoresist pattern. However, the gate insulating layer formed in the high voltage transistor region is in direct contact with a second photoresist pattern exposing only the logic transistor region. Thus, the gate insulating layer for the high voltage transistor can be contaminated by the second photoresist pattern. As a result, the reliability of the gate insulating layer for the high voltage transistor is degraded.

FIG. 1 is a top plan view showing a portion of typical non-volatile memory device having multi-gate insulating layers. In the drawing, the reference character "a" represents a high voltage transistor region in the peripheral circuit region and the reference character "b" represents a cell array region. The cell array region b may correspond to a low voltage transistor region in the peripheral circuit region.

Referring to FIG. 1, a first active region 1a and a second active region 1b are disposed in the high voltage transistor region a and in the cell array region b, respectively. A first gate pattern GP1 runs across the first active region 1a. A first gate insulating layer is interposed between the first gate pattern GP1 and the first active region 1a. The first gate pattern GP1 comprises a first gate electrode, a first inter-gate dielectric layer and a first dummy gate electrode, which are sequentially stacked.

Similarly, a second gate pattern GP2 runs across the second active region 1b. The second gate pattern GP2 comprises a floating gate FG, a second inter-gate dielectric layer and a control gate electrode CG, which are sequentially stacked. A second gate insulating layer, i.e., a tunnel oxide layer, is interposed between the floating gate and the second active region 1b. The second gate insulating layer is thinner than the first gate insulating layer. The floating gate FG should be separated from an adjacent floating gate (not shown) and is overlapped with a portion of the control gate electrode CG. Thus, two patterning processes are required in order to form the floating gate FG. Specifically, the floating gate is formed through a first patterning process for exposing an isolation region 3 adjacent to the second active region 1b and a second patterning process for defining the control gate electrode CG.

In the event that the cell array region b corresponds to the low voltage transistor region in the peripheral circuit region, the second gate pattern GP2 comprises a second gate electrode, a second inter-gate dielectric layer and a second dummy gate electrode which are sequentially stacked. At this time, the second gate electrode is completely overlapped with the second dummy gate electrode.

FIGS. 2–8, 9A, 9B, 10, 11, 12A and 12B are cross sectional views for illustrating a fabrication method of a semiconductor device according to conventional technology. In each drawing, the reference character "a" represents the high voltage transistor region of FIG. 1 and the reference character "b" represents the cell array region of FIG. 1. Also, FIGS. 2–8, 10 and 11 are cross sectional views along the line I—I or the line II—II of FIG. 1. In addition, FIGS. 9A and 12A are cross sectional views along the line I—I of FIG. 1, and FIGS. 9B and 12B are cross sectional views along the line II—II of FIG. 1.

Referring to FIG. 2, a first gate insulating layer 13, i.e., a gate insulating layer for a high voltage transistor, is formed on an entire surface of a semiconductor substrate 11. The first gate insulating layer 13 is formed by thermally oxidizing the semiconductor substrate 11, for example, a silicon substrate. The first gate insulating layer 13 is formed to a thickness of at least 300 A in order to obtain the endurance to high voltages such as a program voltage and/or an erase voltage of 15 volts to 20 volts.

A fist photoresist pattern 15 covering the high voltage transistor region a is formed. The first gate insulating layer 13 is wet-etched using the first photoresist pattern 15 as a etching mask, thereby exposing the substrate 11 of the cell array region b.

Referring to FIG. 3, the first photoresist pattern 15 is removed. A thermal oxidation process is applied to the resultant structure where the first photoresist pattern 15 is removed, to thereby form a second gate insulating layer 17, e.g., a tunnel oxide layer of cell transistor on the exposed substrate of the cell array region b. The second gate insulating layer 17 is formed to a thin thickness of 100 A or the less. At this time, a surface step difference T exists between the first gate insulating layer 13 and the second gate insulating layer 17 as shown in FIG. 3. The surface step difference T corresponds to at least a thickness difference between the first and second gate insulating layers 13 and 17.

A first conductive layer 19 and a chemical mechanical polishing (CMP) stopper layer 21 are sequentially formed on the entire surface of the resultant structure where the first and second gate insulating layers 13 and 17 are formed. The first conductive layer 19 is formed of doped polysilicon layer and the CMP stopper layer 21 is formed of silicon nitride layer.

Referring to FIG. 4, the CMP stopper layer 21 and the first conductive layer 19 are successively patterned to form a first pad pattern in the high voltage transistor region a and a second pad pattern in the cell array region b. The first pad pattern comprises a first conductive layer pattern 19a and a CMP stopper layer pattern 21a which are sequentially stacked on a predetermined region of the high voltage transistor region a. Similarly, the second pad pattern comprises a first conductive layer pattern 19b and a CMP stopper layer pattern 21b which are sequentially stacked on a predetermined region of the cell array region b.

The first and second gate insulating layers 13 and 17 are etched using the first and second pad patterns as etching masks to expose the substrate 11. Subsequently, the exposed substrate 11 is dry-etched, thereby forming a trench region 23 defining at least one first active region 1a in the high voltage transistor region a and at least one second active region 1b in the cell array region b. At this time, the sidewall of the trench region 23 may show a sloped profile as shown in FIG. 4. This is because polymer is adsorbed on the sidewall of the etched region during the dry-etching process.

The resultant structure having the trench region 23 is thermally oxidized to form a thermal oxide layer 25a at the sidewall and bottom of the trench region 23. At this time, a thermal oxide layer 25b may also be formed at the sidewalls of the first and second conductive layer patterns 19a and 19b. The thermal oxide layer 25a is formed in order to repair the etch damage applied to the substrate 11 during the dry-etching process for forming the trench region 23.

Referring to FIG. 5, an insulating layer filling the trench region 23 is formed on the entire surface of the resultant structure where the thermal oxide layer 25a is formed. The insulating layer is planarized until the CMP stopper layer patterns 21a and 21b are exposed, to thereby form an insulating layer pattern 27 in the trench region 23. At this time, the CMP stopper layer pattern 21a in the high voltage transistor region a is more polished as compared to the CMP stopper layer pattern 21b in the cell region b. This is due to the step difference T described in connection with FIG. 3. Thus, a CMP stopper layer pattern 21a' remaining in the high voltage transistor region a becomes thinner than the CMP stopper layer pattern 21b remaining in the cell array region b. As a result, a first depth T1 from the top surface of the insulating layer pattern 27 to the top surface of the first gate insulating layer 13 is shallower than a second depth T2 from the top surface of the insulating layer pattern 27 to the top surface of the second gate insulating layer 17.

Referring to FIG. 6, after removing the CMP stopper layer patterns 21a' and 21b, the insulating layer pattern 27 is recessed to form an isolation layer 27a (or 27b). At this time, it is required to accurately control the recessing process. Specifically, in case that a first isolation layer 27a a top surface 27' of which is higher than that of the first gate insulating layer 13 is formed by under-recessing process, a stringer may be left between the adjacent floating gates to be formed in a subsequent process.

Alternatively, in case that a second isolation layer 27b a top surface 27" of which is lower than that of the first gate insulating layer 13 is formed by over-recessing process, thinning effect of the first gate insulating layer 13 is occurred. In other words, a dielectric breakdown characteristic between the first active region 1a and a gate electrode of the high voltage transistor to be formed in a subsequent process is degraded. In particular, in the event that the top surface 27" of the second isolation layer 27b has the same height as the top surface of the second gate insulating layer 17, it is possible to completely remove the stringer between the adjacent floating gates. In this case, however, the dielectric breakdown characteristic of the high voltage transistor is remarkably degraded.

FIGS. 7, 8, 9A and 9B are cross sectional views for illustrating problems of conventional technology in more detail, in the case in which the top surface of the first isolation layer 27a has the same height as the top surface of the first gate insulating layer 13.

Referring to FIG. 7, a second conductive layer 29 is formed on the entire surface of the resultant structure where the first isolation layer 27a is formed. A second photoresist pattern 31 covering the high voltage transistor region a and the second active region 1b is formed on the second conductive layer 29.

Referring to FIG. 8, the second conductive layer 29 is etched using the second photoresist pattern 31 as a etching mask, to thereby form a second conductive layer pattern exposing the first isolation layer 27a in the cell array region b. The second conductive layer pattern comprises a second conductive layer pattern 29a covering the entire surface of the high voltage transistor region a and a second conductive layer pattern 29b covering the second active region 1b. An inter-gate dielectric layer 33 and a third conductive layer 35 are sequentially formed on the entire surface of the resultant having the second conductive layer patterns 29a and 29b.

Referring to FIGS. 9A and 9B, the third conductive layer 35, the inter-gate dielectric layer 33, the second conductive layer patterns 29a and 29b, and the first conductive layer patterns 19a and 19b are anisotropically etched, thereby forming a first gate pattern GP1 crossing over the first active region 1a and a second gate pattern GP2 crossing over the second active region 1b. At this time, stringer 19s exists on the edge of the second active region 1b between the adjacent second gate patterns. The stringer 19s is formed due to the sloped sidewall of the first conductive layer pattern 19b. As the top surface of the first isolation layer 27a becomes higher, it is more difficult to remove the stringer 19s.

The first gate pattern GP1 comprises a first gate electrode 30a, a first inter-gate dielectric layer 33a and a first dummy gate electrode 35a which are sequentially stacked. Also, the first gate electrode 30a comprises a first conductive layer pattern 19a' covering a portion of the first gate insulating layer 13 and a second conductive layer pattern 29a' running over the first conductive layer pattern 19a'. Similarly, the second gate pattern GP2 comprises a floating gate FG, a second inter-gate dielectric layer 33b and a control gate electrode CG which are sequentially stacked. Also, the floating gate FG comprises a first conductive layer pattern 19b' covering a portion of the second gate insulating layer 17 and a second conductive layer pattern 29b' covering the first conductive layer pattern 19b'.

In addition, in the event that a silicon nitride spacer (not shown) is formed on the sidewalls of the first and second gate pattern GP1 and GP2 using the conventional manner, a spacer residue 37 is formed on the sidewall of the stringer 19s as shown in FIG. 9A. This is because a step difference exists between the top surface of the second active region 1b and the top surface of the first isolation layer 27a adjacent to the second active region 1b. Accordingly, in case that a contact hole, e.g., a borderless contact hole, is formed on the second active region 1b in a subsequent process, an area of the second active region 1b to be exposed by the contact hole is reduced.

FIGS. 10, 11, 12A and 12B are cross sectional views for illustrating problems of conventional technology in more detail, in the case in which the top surface of the second isolation layer 27b has the same height as the top surface of the second gate insulating layer 17. Referring to FIGS. 10, 11, 12A and 12B, the first gate pattern GP1 and the second gate pattern GP2 are formed using the same manner as that described in connection with FIGS. 7, 8, 9A and 9B. In this case, even if the sidewall of the first conductive layer patterns 19a and 19b has the sloped profile, no stringer may be formed at the edge of the second active region 1b. This is because the top surface of the second isolation layer 27b has the same height as that of the second gate insulating layer 17. However, as shown in FIG. 12B, an effective thickness of the first gate insulating layer 13 is relatively reduced at the edge portion W of the first gate insulating layer 13.

As described above, according to the conventional technology, it is difficult to determine an optimal condition for recessing the insulating layer pattern in the trench region. Even though the trench region shows a vertical sidewall profile, the top surface of the isolation layer should be higher than that of the first gate insulating layer in order to avoid the thinning effect of the first gate insulating layer. If the step difference between the first and second gate insulating layers is increased, a process margin for recessing the insulating layer pattern is reduced. In the meantime, in the case in which the sidewall of the trench region shows a severe slope, the top surface of the isolation layer should be lower than that of the first gate insulating layer in order to suppress the occurrence of the stringer. However, if the top surface of the isolation layer is lower than that of the first gate insulating layer, the effective thickness of the first gate insulating layer is reduced.

SUMMARY OF THE INVENTION

It is therefore an object of the present invention to provide semiconductor device having high reliability by minimizing the step difference between the multi-gate insulating layers having different thicknesses from each other.

It is another object of the present invention to provide methods of fabricating a semiconductor device, which can increase the process margin of the recessing process for forming an isolation layer by minimizing the step difference between the multi-gate insulating layers having different thicknesses from each other.

It is still another object of the present invention to provide methods of fabricating a semiconductor device, which can prevent the stringer from being formed between the neighboring gate electrodes.

It is still another object of the present invention to provide methods of fabricating a semiconductor device, which can improve the dielectric breakdown characteristic of the multi-gate insulating layers having different thicknesses from each other.

According to one aspect of the present invention, the semiconductor device includes a plurality of active regions defined by an isolation region formed at a predetermined region of a semiconductor substrate. The plurality of the active regions comprise at least one first active region and at least one second active region. A top surface of the first active region is lower than that of the second active region. The first and second active regions are covered with a first gate insulating layer and a second gate insulating layer, respectively. The first gate insulating layer is thicker than the second gate insulating layer. An isolation region is formed on the semiconductor substrate between the plurality of active regions. A bottom of the isolation region is lower than the surface of the first active region. The isolation region is filled with an isolation layer which covers an entire sidewall of the first gate insulating layer and the second gate insulating layer.

In one embodiment, the step difference between the top surfaces of the first and second gate insulating layers is less than the thickness difference between the first and second insulating layers.

Also, in one embodiment, the bottom of the isolation region is lower than the top surface of the first active region. The isolation region can be a trench region etched in a predetermined region of the semiconductor substrate.

To achieve the above objects, the method according to one embodiment of the present invention includes the steps of forming a first gate insulating layer a bottom surface of which is lower than a main surface of a semiconductor substrate at a predetermined region of the semiconductor substrate. A second gate insulating layer which is thinner than the first insulating layer is formed at the main surface of the substrate adjacent to the first gate insulating layer. A first conductive layer and a chemical mechanical polishing (CMP) stopper layer are sequentially formed on the entire surface of the resultant having the first and second gate insulating layers. The CMP stopper layer, the first conductive layer, the first and second gate insulating layer, and the substrate are successively etched to form an isolation region, e.g., a trench region defining a first active region under the first gate insulating layer and a second active region under the second gate insulating layer. An insulating layer pattern is formed inside the isolation region. The patterned CMP stopper layer is then removed. The insulating layer pattern is recessed to form an isolation layer.

The first and second gate insulating layers are can be formed of a thermal oxide layer.

The insulating layer pattern can be recessed so that the entire sidewalls of the first and second gate insulating layers are still covered with the isolation layer.

To achieve the above objects, the method according to another embodiment of the present invention includes the steps of forming a plurality of pad patterns on a semiconductor substrate. The substrate is then etched using the pad patterns as etching masks, thereby forming a trench region defining at least one first active region and at least one second active region. An insulating layer pattern is formed in the trench region. The pad pattern on the first active region is selectively removed to expose the first active region. A first gate insulating layer is formed at the surface of the first active region. A bottom surface of the first gate insulating layer can be lower than the top surface of the second active region. The pad pattern on the second active region is then removed to selectively expose the second active region. A second gate insulating layer which is thinner than the first gate insulating layer is formed at the surface of the second active region.

The bottom surface of the first gate insulating layer can be lower than that of the second gate insulating layer.

Also, the first and second gate insulating layer can be formed of a thermal oxide layer.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF PREFERRED
EMBODIMENTS OF THE INVENTION

Figure 1:
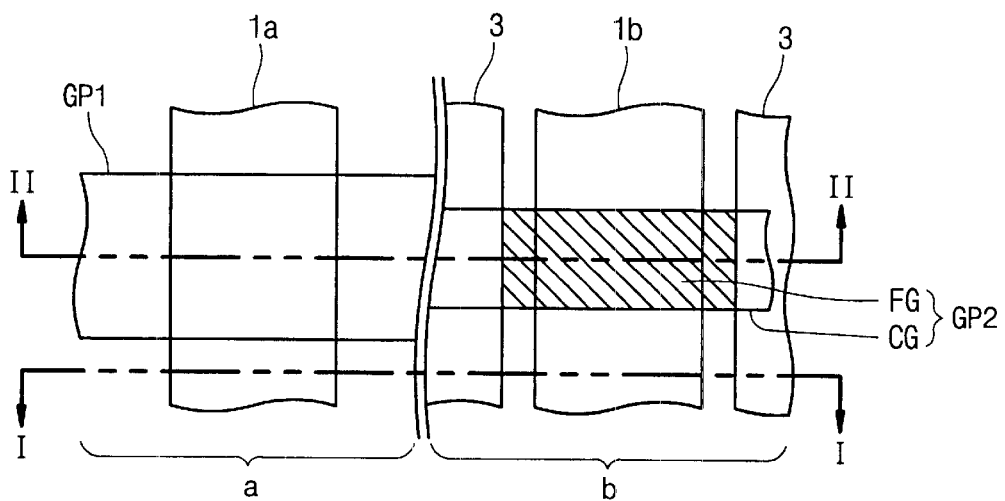
FIG. 1 is a top plan view showing a portion of typical non-volatile memory device having multi-gate insulating layers.
Figure 2:
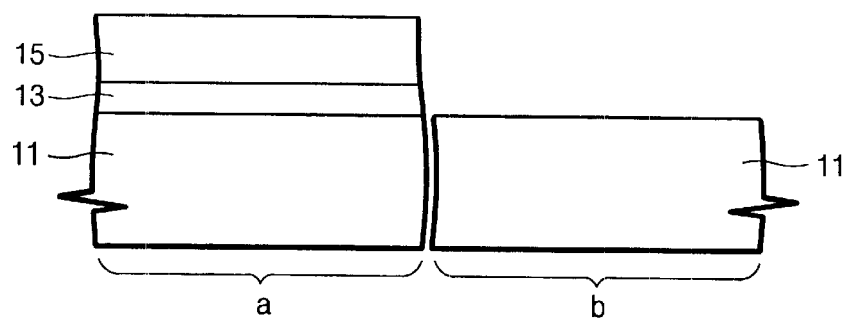
FIGS. 2–8, 9A, 9B, 10, 11, 12A and 12B are cross sectional views for illustrating a conventional method of fabricating a semiconductor device.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being on another layer or substrate, it can be directly on the other layer or substrate, or intervening layers may also be present. In the drawings, the reference character "a" represents the high voltage transistor region of FIG. 1, and the reference character "b" represents the cell array region of FIG. 1. Also, FIGS. 13–22, 24–30 and 32 are cross sectional views along the line I—I or the line II—II of FIG. 1. In addition, FIGS. 23A and 31A are cross sectional views along the line I—I of FIG. 1 and FIGS. 23B and 31B are cross sectional views along the line II—II of FIG. 1.

Figure 32:
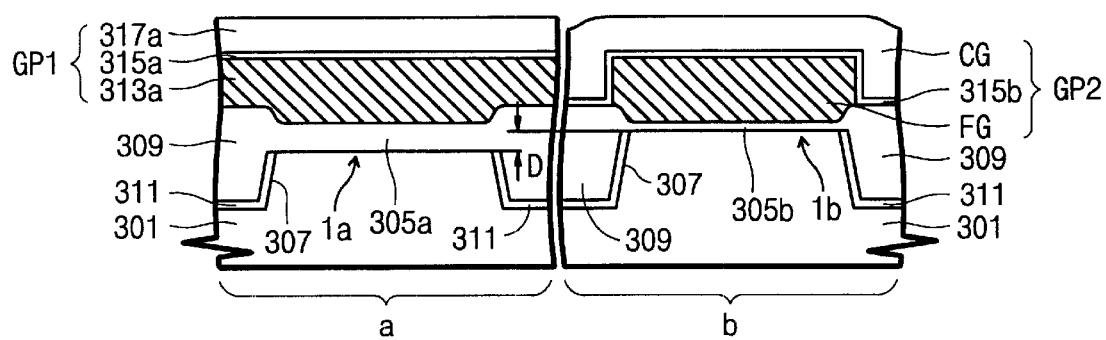
FIG. 32 is a cross sectional view showing a semiconductor device having multi-gate insulating layers according to the present invention.

Referring to FIG. 32, an isolation region 307 defining a plurality of active regions is formed at a predetermined region of a semiconductor substrate 301, for example a silicon substrate. The plurality of active regions comprises at least one first active region 1a defined in the high voltage transistor region a and at least one second active region 1b defined in the cell array region b.

A top surface of the first active region 1a is preferably lower than that of the second active region 1b. Also, the bottom surface of the isolation region 307 is preferably lower than the top surface of the first active region 1a. The isolation region 307 may be a trench region which is etched in the substrate 301.

The first active region 1a is covered with a first gate insulating layer 305a. Similarly, the second active region 1b is covered with a second gate insulating layer 305b. Step difference between the top surfaces of the first and second gate insulating layers 305a and 305b is preferably less than the thickness difference between the first and second gate insulating layers 305a and 305b. Most preferably, the top surface of the first gate insulating layer 305a has the same height as that of the second gate insulating layer 305b. In other words, it is most preferable that the thickness of the first gate insulating layer 305a is equal to a total value of a step difference D between the top surfaces of the first and second gate insulating layers 305a and 305b and the thickness of the second gate insulating layer 305b.

The isolation region 307 is filled with an isolation layer 309. Preferably, the entire sidewalls of the first and second gate insulating layers 305a and 305b are covered with the isolation layer 309. In other words, it is preferable that the top surface of the isolation layer 309 has the same or higher height as the highest top surface among the top surfaces of the first and second gate insulating layers 305a and 305b. A thin thermal oxide layer 311 may be interposed between the isolation layer 309 and the substrate 301. The thermal oxide layer 311 is formed in order to repair the etch damages applied to the isolation region 307, e.g., the trench region.

A first gate pattern GP1 is located on a predetermined region of the first gate insulating layer 305a and crosses over the first active region 1a. The first gate pattern GP1 comprises a first gate electrode 313a, a first inter-gate dielectric layer 315a and a first dummy gate electrode 317a which are sequentially stacked. Also, a second gate pattern GP2 is located on a predetermined region of the second gate insulating layer 305b and crosses over the second active region 1b. The second gate pattern GP2 comprises a floating gate FG, a second inter-gate dielectric layer 315b and a control gate electrode CG which are sequentially stacked. Here, the floating gate FG is located only at the overlap region between the control gate electrode CG and the second active region 1b, whereas the control gate electrode CG runs across the second active region 1b.

In the event that the cell array region b corresponds to a low voltage transistor region in a peripheral circuit region, the second gate pattern GP2 comprises a second gate electrode, a second inter-gate dielectric layer and a second dummy gate electrode which are sequentially stacked. Here, the second gate electrode is completely overlapped with the second dummy gate electrode, unlike the floating gate FG.

The methods of fabricating a semiconductor device according to the embodiments of the present invention will be described hereinafter. FIGS. 13–22, 23A and 23B are cross sectional views for illustrating a fabrication method of semiconductor device according to one embodiment of the present invention.

Figure 13:
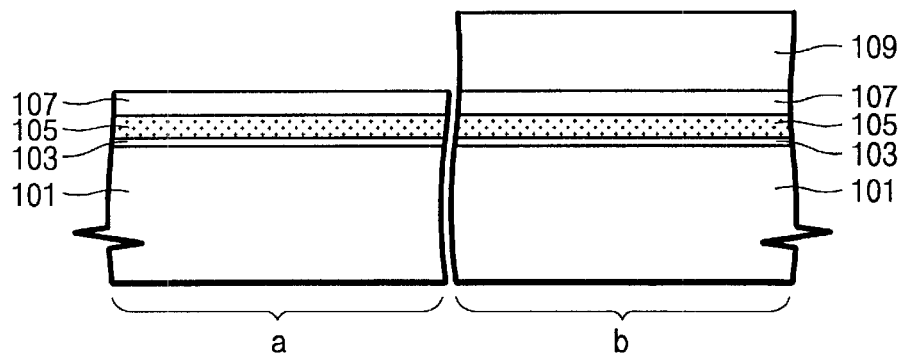
FIGS. 13–22, 23A and 23B are cross-sectional views for illustrating a method of fabricating a semiconductor device according to one embodiment of the present invention.

Referring to FIG. 13, a pad oxide layer 103, a pad nitride layer 105 and a mask oxide layer 107 are sequentially formed on a main surface of a semiconductor substrate 101, e.g., a silicon substrate. The pad oxide layer 103 is formed by thermally oxidizing the substrate 101 and the pad nitride layer 105 is formed of a chemical vapor deposition (CVD) silicon nitride layer. Also, the mask oxide layer 107 is preferably formed of a material layer having an etching selectivity with respect to the pad nitride layer 105, for example, CVD oxide layer. The pad oxide layer 103 is formed to a thickness of 200 A or less, preferably to a thickness of 100 A or less and the pad nitride layer 105 is formed to a thickness of 50 A to 200 A. Also, the mask oxide layer 107 is formed to a thickness of 100 A to 500 A. A first photoresist pattern 109 exposing the high voltage transistor region a, i.e., a first region, is formed on the mask oxide layer 107.

Figure 14:
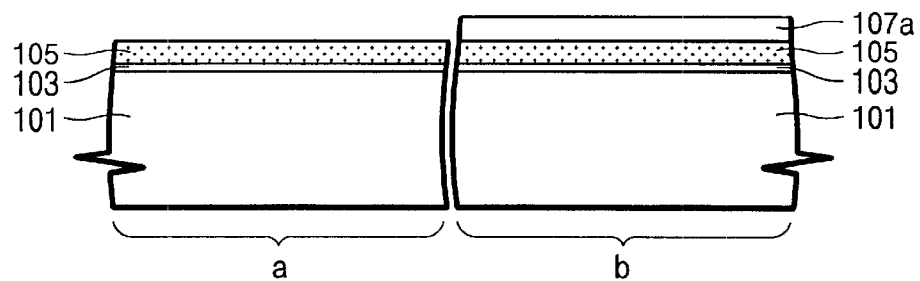

Referring to FIG. 14, the mask oxide layer 107 is etched using the first photoresist pattern 109 as a etching mask, to thereby form a patterned mask oxide layer 107a covering the cell array region b, i.e., a second region. The mask oxide layer 107 is preferably etched using a wet etchant such as hydrofluoric acid (HF) or buffered oxide etchant (BOE). This is because etch damage may be applied to the main surface of the substrate 101 in case that the mask oxide layer 107 is etched by dry etching process. The first photoresist pattern 109 is then removed.

Figure 15:
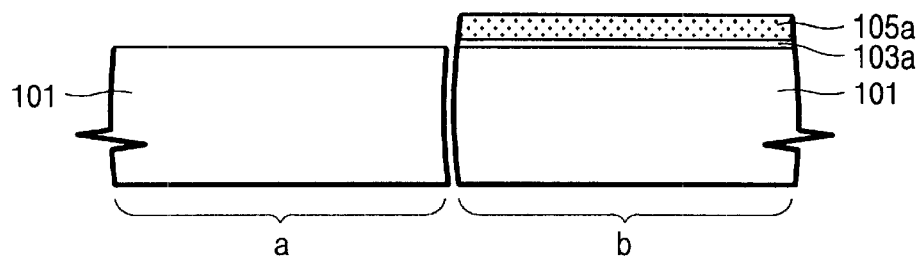

Referring to FIG. 15, the pad nitride layer 105 in the high voltage transistor region a is selectively etched using the patterned mask oxide layer 107a as an etching mask, thereby forming a patterned pad nitride layer 105a covering the cell array region b. Preferably, the pad nitride layer 105 is also etched using a wet etchant such as phosphoric acid ($H_3PO_4$) in order to prevent the etch damage from being applied to the substrate 101. The pad oxide layer 103 is then wet-etched using the patterned pad nitride layer 105a as an etching mask, to thereby form a patterned pad oxide layer 103a covering the cell array region b. As a result, the patterned mask oxide layer 107a is removed and the substrate 101 in the high voltage transistor region a is selectively exposed.

Figure 3:
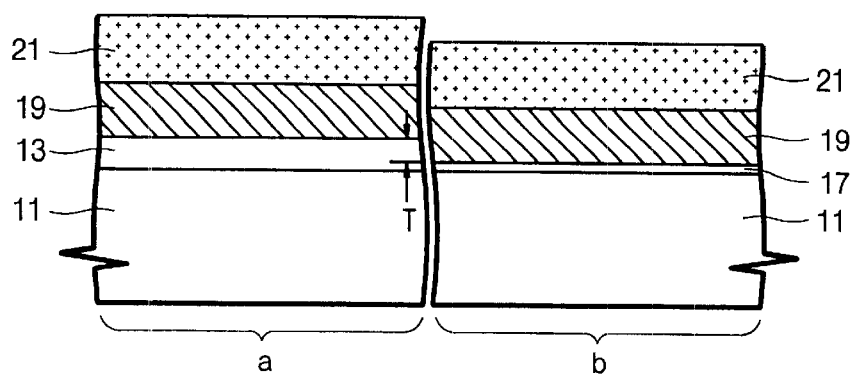
Figure 4:
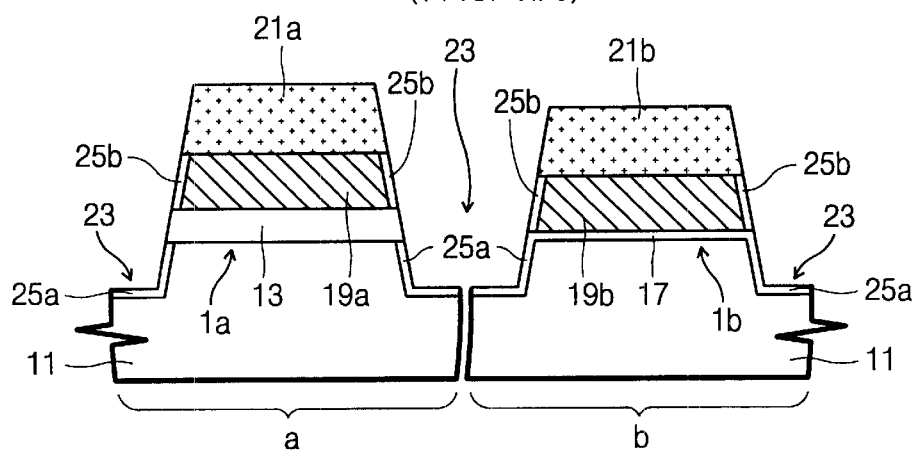

In the meantime, the process for forming the mask oxide layer 107 shown in FIG. 3 may be omitted. At this time, adhesion between the first photoresist pattern 109 and the pad nitride layer 105 should be strong in order to prevent the photoresist pattern 109 from being lifted away during the wet etching process using the phosphoric acid ($H_3PO_4$).

Figure 16:
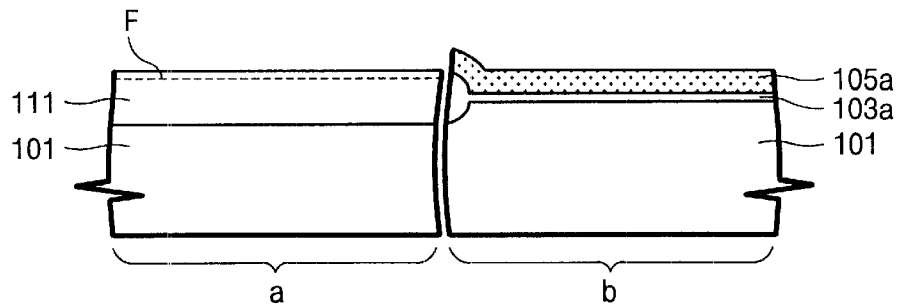

Referring to FIG. 16, a thermal oxidation process is applied to the resultant structure where the substrate 101 in the high voltage transistor region a is exposed, thereby selectively forming a first gate insulating layer 111, e.g., a first gate oxide layer at the surface of the exposed substrate 101. At this time, the first gate insulating layer 111 has a bottom surface which is lower than the main surface of the substrate 101 due to the characteristic of the thermal oxidation process, as shown in FIG. 16. However, the top surface of the first gate insulating layer 111 is higher than the main surface of the substrate 101. Accordingly; a recessing process for lowering the top surface of the first gate insulating layer 111 may be additionally carried out so that the first gate insulating layer 111 has a top surface F close to the main surface of the substrate 101. As a result, the first gate insulating layer 111 is preferably formed to a thickness which is thicker than a final thickness of the first gate insulating layer to be left in a subsequent process, considering the recessing process. For example, in case that a gate insulating layer having a thickness of 350 A is required for the high voltage transistor, the first gate insulating layer 111 is preferably formed to an initial thickness of at least 700 A. At this time, it is preferable that the first gate insulating layer 111 is recessed by a thickness of 150 to 200 A.

In addition, the exposed substrate 101 in the high voltage transistor region a can be etched to a predetermined depth using the patterned pad nitride layer 105a as an etching mask prior to formation of the first gate insulating layer 111. In this case, it is possible to form the first gate insulating layer 111 having a top surface which is close to the main surface height of the substrate 101 without performing the recessing process of the first gate insulating layer 111.

Figure 17:
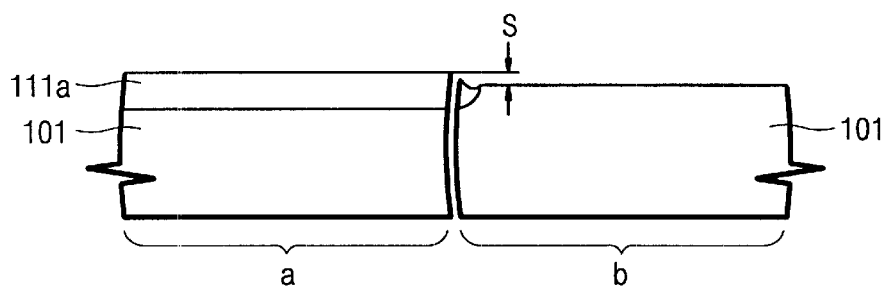

Referring to FIG. 17, the patterned pad nitride layer 105a is removed using wet etchant such as phosphoric acid. The patterned pad oxide layer 103a is then wet-etched to expose the substrate 101 in the cell array region b. At this time, the first gate insulating layer 111 is recessed by a thickness of the patterned pad oxide layer 103a or more. Thus, the first gate insulating layer 111a remaining in the high voltage transistor region a has a thickness of about 350 A to 400 A. As a result, a step difference S between the top surfaces of the first gate insulating layer 111a and the exposed substrate 101 is remarkably reduced, as compared to the conventional technology.

Figure 6:
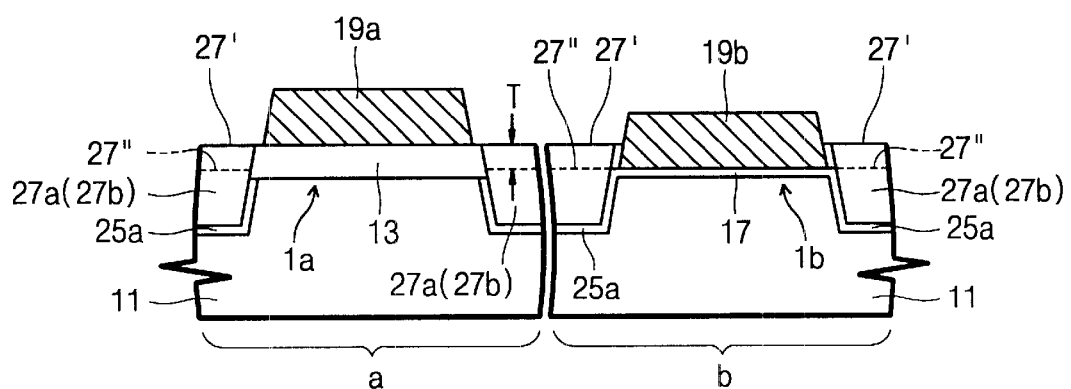
Figure 7:
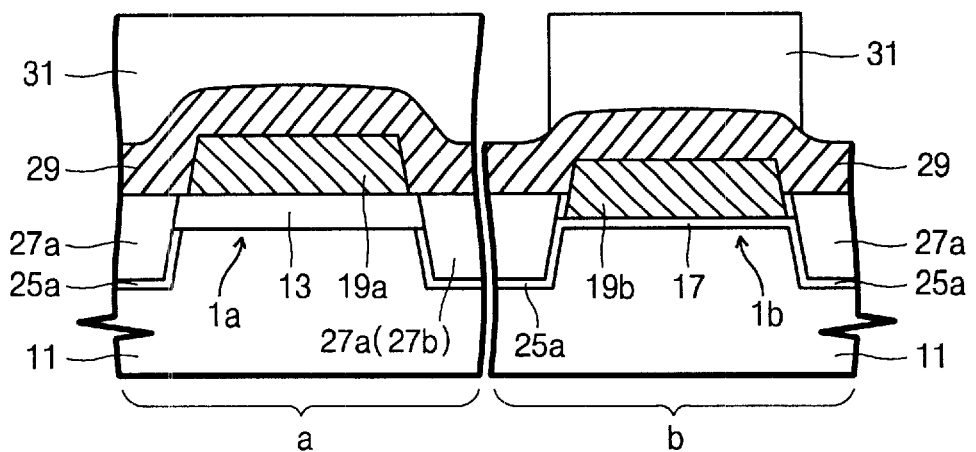
Figure 8:
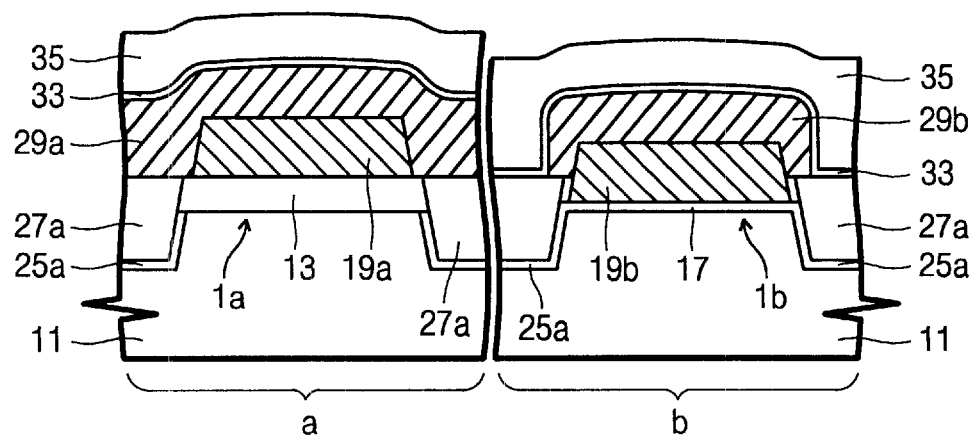
Figure 9A:
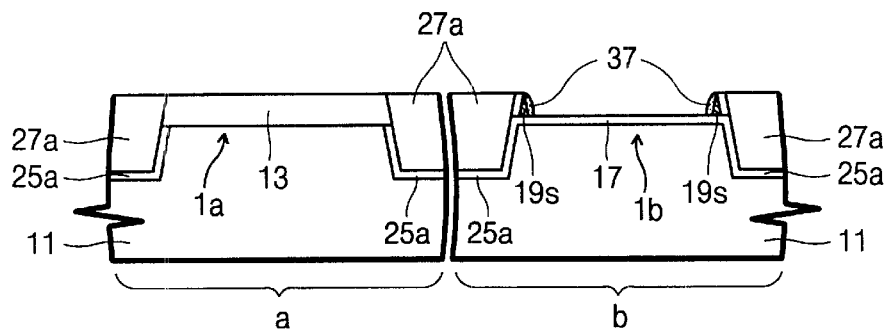
Figure 9B:
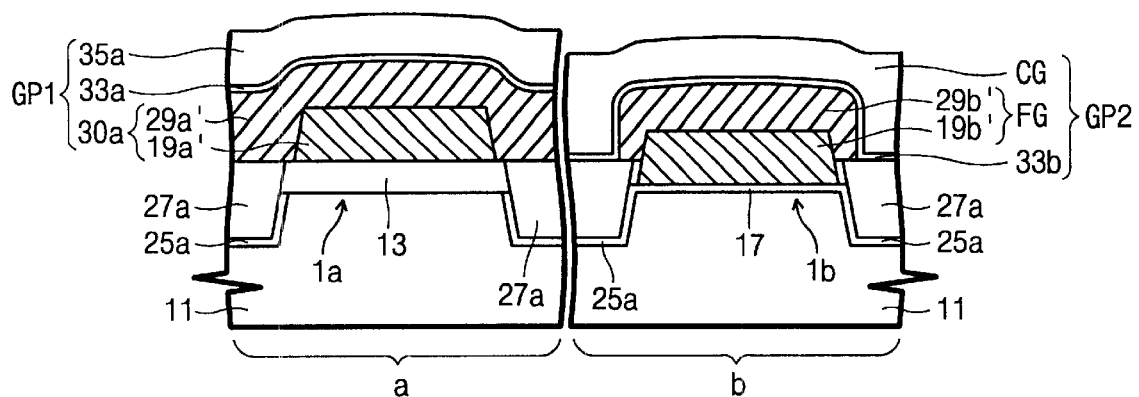
Figure 10:
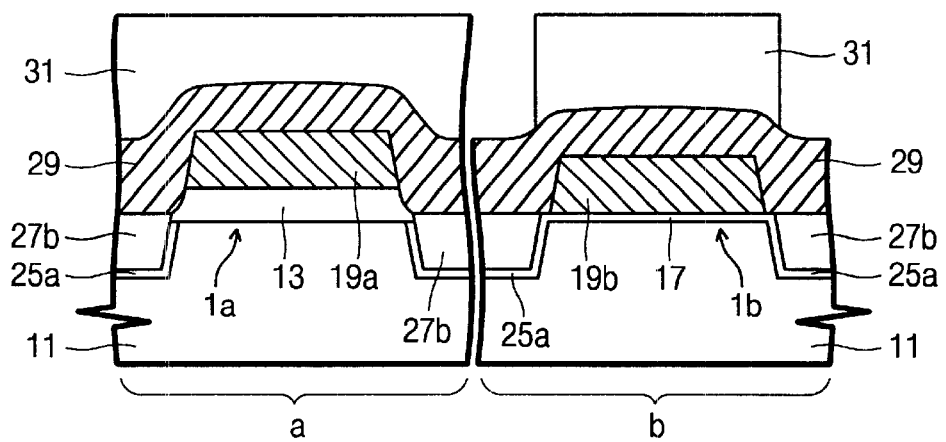
Figure 11:
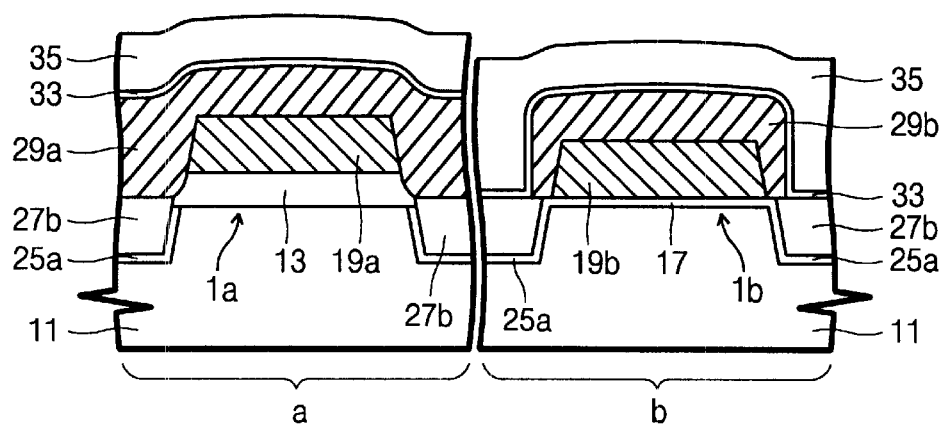
Figure 12A:
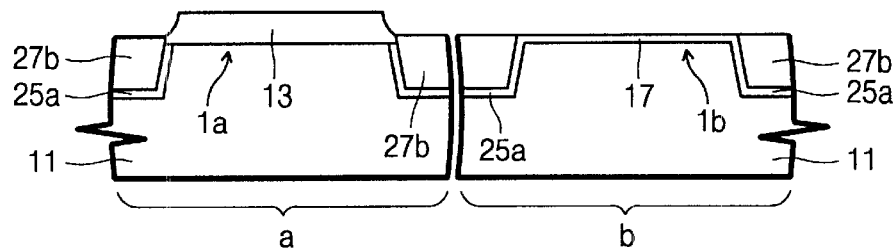
Figure 12B:
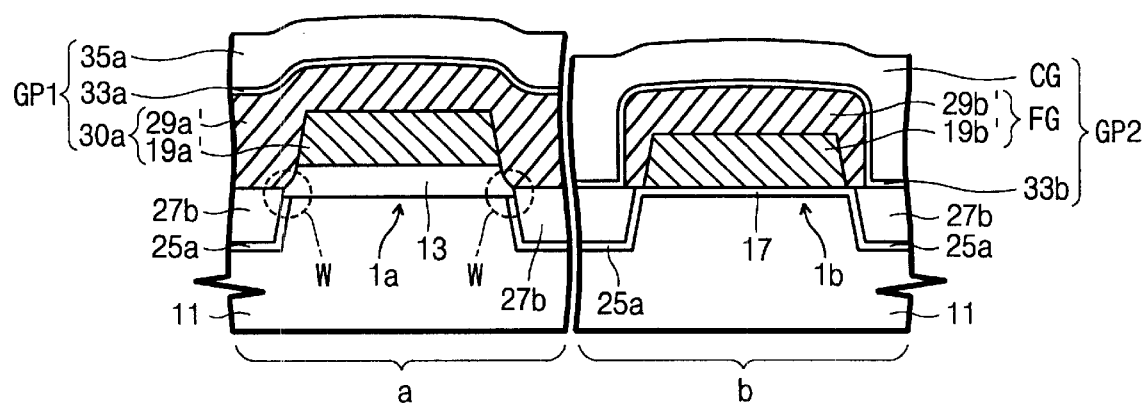

Alternatively, the recessing process of the first gate insulating layer 111 described in connection with FIG. 6 may be omitted. In this case, it is possible to form the first gate insulating layer 111a by over-etching the patterned pad oxide layer 103a.

Figure 18:
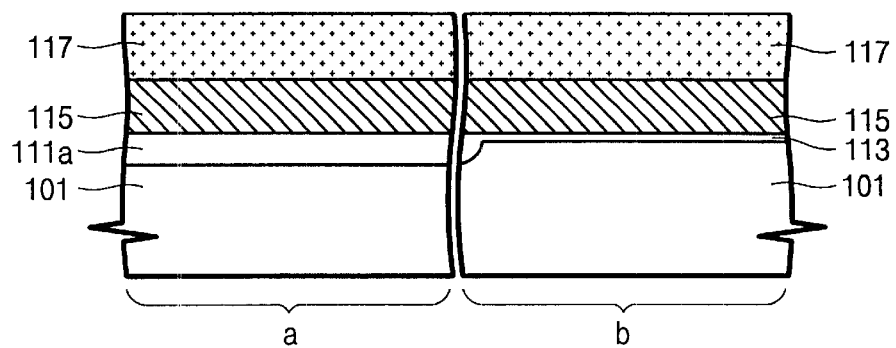

Referring to FIG. 18, a thermal oxidation process is applied to the resultant structure where the patterned pad oxide layer 103a is removed, thereby forming a second gate insulating layer 113 having a thin thickness of 80 A or less, e.g., a thin tunnel oxide layer at the surface of the exposed substrate 101 in the cell array region b. Therefore, the step difference between the top surface of the first and second gate insulating layers 111a and 113 is reduced, as compared to the conventional technology. It is most preferable that the top surface of the first gate insulating layer 111a has the same height as that of the second gate insulating layer 113. A first conductive layer 115 and a CMP stopper layer 117 are sequentially formed on the resultant structure having the first and second gate insulating layers 111a and 113. The first conductive layer 115 is preferably formed of doped polysilicon layer having a thickness of 500 A to 1000 A, and the CMP stopper layer 117 is preferably formed of silicon nitride layer having a thickness of 500 A to 2000 A.

Figure 19:
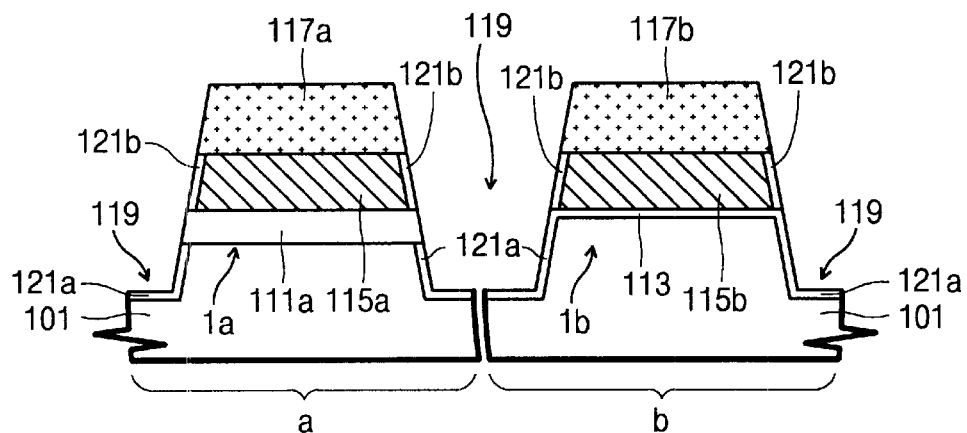

Referring to FIG. 19, the CMP stopper layer 117 and the first conductive layer 115 are successively patterned to form at least one first pad pattern and at least one second pad pattern in the high voltage transistor region a and in the cell array region b, respectively. The first pad pattern comprises a first conductive layer pattern 115a and a CMP stopper layer pattern 117a which are sequentially stacked on a predetermined region of the high voltage transistor region a. Similarly, the second pad pattern comprises a first conductive layer pattern 115b and a CMP stopper layer pattern 117b which are sequentially stacked on a predetermined region of the cell array region b.

The first and second gate insulating layers 111a and 113 are concurrently dry-etched using the CMP stopper layer patterns 117a and 117b as etching masks, thereby exposing a portion of the substrate 101. Subsequently, the exposed substrate 101 is dry-etched using the CMP stopper layer patterns 117a and 117b as etching masks, to thereby form an isolation region 119, e.g., a trench region defining a first active region 1a under the first pad pattern and a second active region 1b under the second pad pattern.

A thermal oxidation process is applied to the resultant structure having the isolation region 119, thereby forming a thermal oxide layer 121a at the sidewall and bottom of the isolation region 119. At this time, a thermal oxide layer 121b is also formed at the sidewalls of the first conductive layer patterns 115a and 115b, e.g., polysilicon patterns. The thermal oxidation process is performed in order to cure etch damage applied to the substrate 101 during etching process for forming the trench region.

Figure 20:
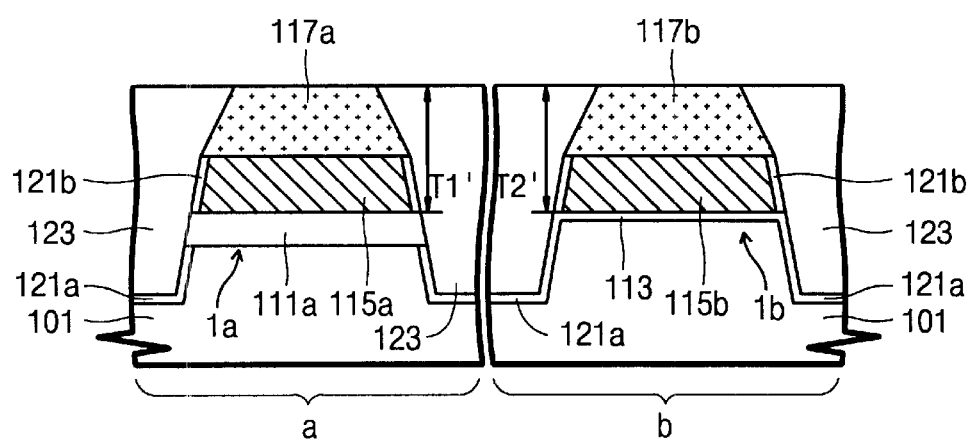

Referring to FIG. 20, an insulating layer filling the isolation region 119 is formed on the entire surface of the resultant having the thermal oxide layers 121a and 121b. The insulating layer is preferably formed of high density plasma (HDP) oxide layer. The HDP oxide layer is formed by alternately performing a deposition process and a sputter etching process. In particular, top corner regions of protrusions are more etched than plane area. Thus, gap regions having a high aspect ratio can be completely filled with the HDP oxide layer. Also, in case that the insulating layer is formed of the HDP oxide layer, the sidewalls of the CMP stopper layer patterns 117a and 117b show sloped profiles. This is due to the sputter etching process performed repeatedly during the HDP process.

The insulating layer is planarized until the CMP stopper layer patterns 117a and 117b are exposed. The planarizing process is preferably performed using a CMP process. As a result, an insulating layer pattern 123 is formed in the isolation region 119. At this time, a difference between a first depth T1' from the top surface of the CMP stopper layer pattern 117a to the top surface of the first gate insulating layer 111a and a second depth T2' from the top surface of the CMP stopper layer pattern 117b to the top surface of the second gate insulating layer 111b is remarkably reduced, as compared to the conventional technology. This is because the step difference between the top surfaces of the first and second gate insulating layers 111a and 113 is less than that of the conventional technology. Most preferably, the first depth T1' is equal to the second depth T2'.

Figure 21:
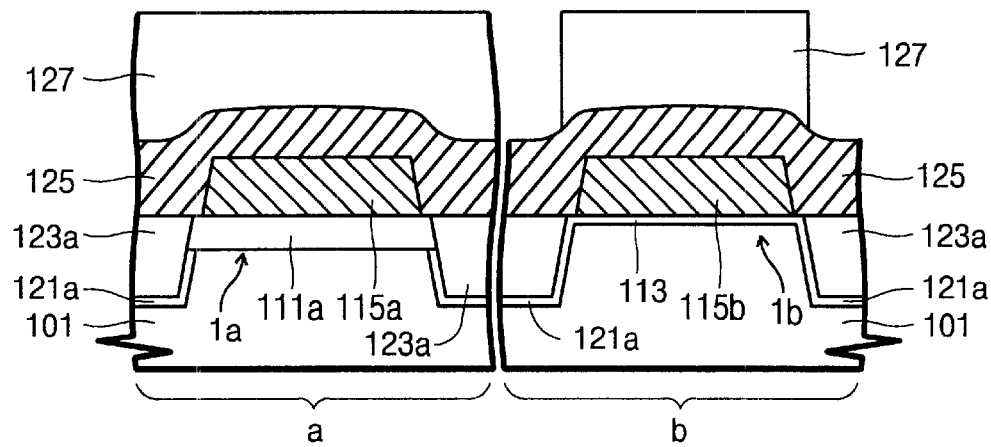

Referring to FIG. 21, after removing the CMP stopper layer patterns 117a and 117b, the insulating layer pattern 123 is recessed to form an isolation layer 123a. Here, in the event that the first depth T1' is shallower than the second depth T2', the insulating layer pattern 123 is preferably etched by the first depth T1'. On the contrary, in the event that the first depth T1' is deeper than the second depth T2', the insulating layer pattern 123 is preferably etched by the second depth T1'. As a result, it is preferable that the isolation layer 123a covers the entire sidewalls of the first and second gate insulating layers 111a and 113.

Figure 5:
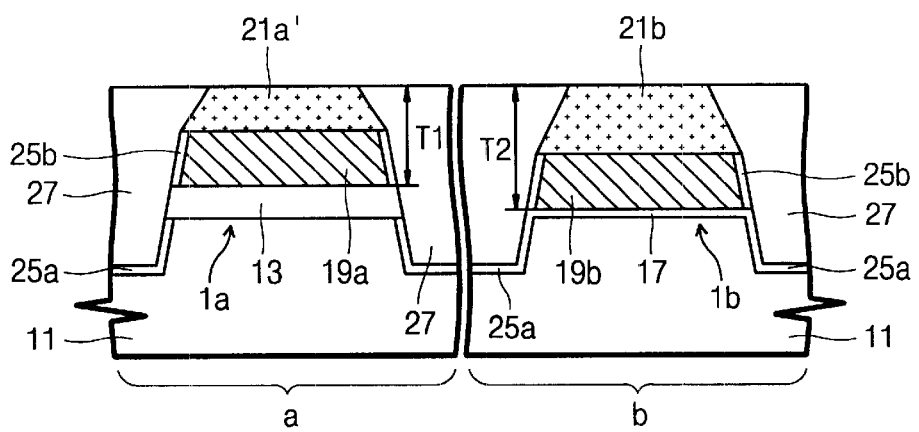

As the difference between the first depth T1' and the second depth T2' is decreased, the process margin for recessing the insulating layer pattern 123 becomes larger. For example, in case that the first depth T1' is equal to the second depth T2', the maximum allowable recessing limit of the insulating layer pattern 123 corresponds to the first depth T1' or the second depth T2'. However, the maximum allowable recessing limit of the insulating layer pattern 27 according to the conventional technology corresponds to the first depth T1, as shown in FIG. 5. Here, the first depth T1 of FIG. 5 is shallower than the first depth T1' of the present invention. This is because the thickness of the CMP stopper layer pattern 21a' of FIG. 5 becomes decreased due to the step difference between the top surfaces of the first and second gate insulating layers 13 and 17 during the CMP process.

A second conductive layer 125 such as a doped polysilicon layer is formed on the entire surface of the substrate including the isolation layer 123a. A second photoresist pattern 127 is formed on the second conductive layer 125 using a photo mask for exposing the isolation layer 123a adjacent to the second active region 1b. Thus, the entire surface of the high voltage transistor region a and the second active region 1b are covered with the second photoresist pattern 127, as shown in FIG. 21.

Figure 22:
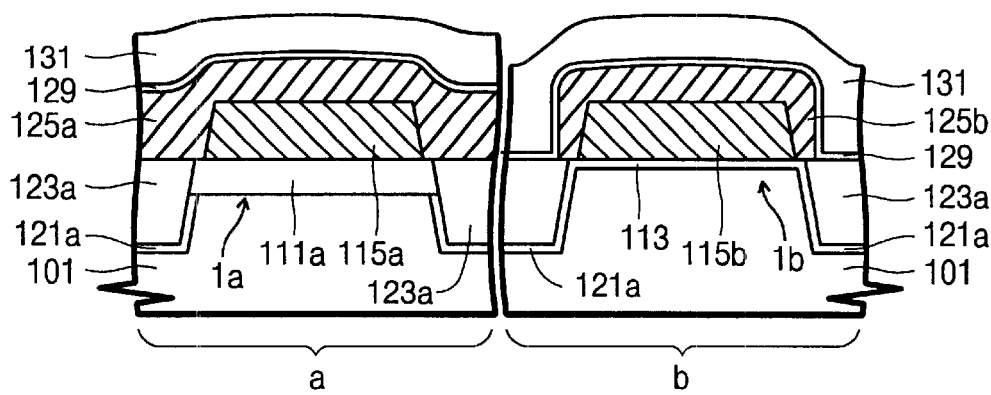
Figure 23A:
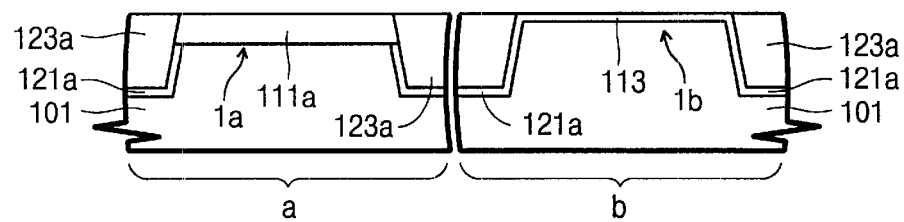
Figure 23B:
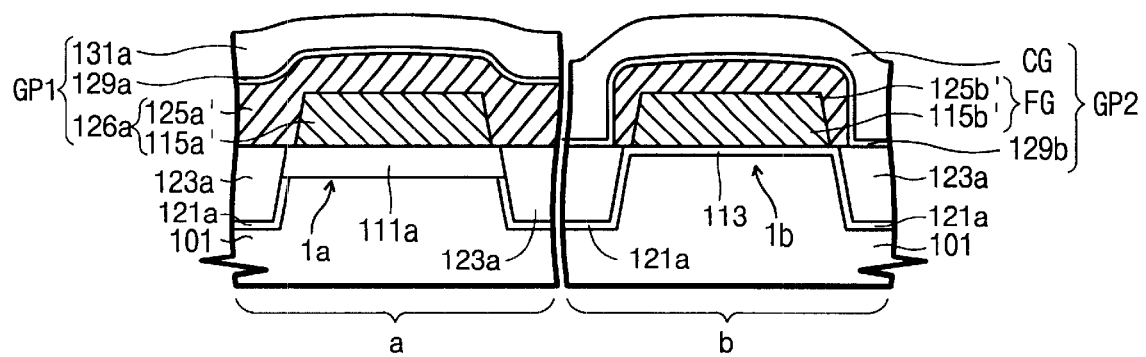

Referring to FIG. 22, the second conductive layer 125 is etched using the second photoresist pattern 127 as an etching mask, thereby forming a second conductive layer pattern 125a covering the high voltage transistor region a and a second conductive layer pattern 125b covering the second active region 1b. The second photoresist pattern 127 is then removed. An inter-gate dielectric layer 129 and a third conductive layer 131 are sequentially formed on the entire surface of the resultant where the second photoresist pattern 127 is removed. The inter-gate dielectric layer 129 is formed of a silicon oxide layer or a multi-layered dielectric layer including a silicon nitride layer. A nitride/oxide (N/O) layer or an oxide/nitride/oxide (O/N/O) layer is widely used as the multi-layered dielectric layer. Also, the third conductive layer 131 may be formed of a doped polysilicon layer or a refractory metal polycide layer. A tungsten polycide layer, titanium polycide layer, a tantalum polycide layer or the like can be widely used as the refractory metal polycide layer.

In the meantime, in case that the cell array region b corresponds to the low voltage transistor region in peripheral circuit region, there is no need to form the second photoresist pattern 127. In other words, the second photoresist pattern 127 is required in case of forming the floating gate FG of non-volatile memory device shown in FIGS. 1 and 32.

Referring to FIGS. 23A and 23B, the third conductive layer 131, the inter-gate dielectric layer 129, the second conductive layer patters 125a and 125b, and the first conductive layer patterns 115a and 115b are successively patterned, thereby forming a first and second gate patterns GP1 and GP2 crossing over the first and second active regions 1a and 1b respectively. The first gate pattern GP1 comprises a first gate electrode 126a, a first inter-gate dielectric layer 129a and a first dummy gate electrode 131a which are sequentially stacked. Here, the first gate electrode 126a comprises a first conductive layer pattern 115a' remaining on the first gate insulating layer 111a and a second conductive layer pattern 125a' crossing over the first conductive layer pattern 115a.

Also, the second gate pattern GP2 comprises a floating gate FG, a second inter-gate dielectric layer 129b and a control gate electrode CG which are sequentially stacked. Here, the floating gate FG comprises a first conductive layer pattern 115b' remaining on the second gate insulating layer 113 and a second conductive layer pattern 125b' covering the first conductive layer pattern 115b.

In the meantime, though not shown in the figure, in the event that the cell array region b corresponds to the low voltage transistor region, the second gate pattern GP2 has the same structure as the first gate pattern GP1. That is to say, the second gate pattern GP2 to be formed in the low voltage transistor may comprise a second gate electrode, a second inter-gate dielectric layer and a second dummy gate electrode which are sequentially stacked.

As described above, as the step difference between the top surfaces of the first and second gate insulating layers 111a and 113 is reduced, the maximum allowable recessing limit of the insulating layer pattern 123 becomes larger. Thus, it is possible to increase the process margin for preventing the failures of the first and second gate insulating layers 111a and 113 as shown in FIG. 23B. Also, even if the sidewalls of the first conductive layer patterns (115a and 115b of FIG. 19) show a sloped profile, stringer composed of a residue of the first conductive layer pattern 115a or 115b is not formed at the edge of the first or second active region 1a or 1b as shown in FIG. 23A. As a result, the present invention provides an optimal process condition, which can prevent the stringer from being formed between the adjacent floating gates and improve the dielectric breakdown characteristic of the multi-gate insulating layers having different thickness from each other.

Figure 24:
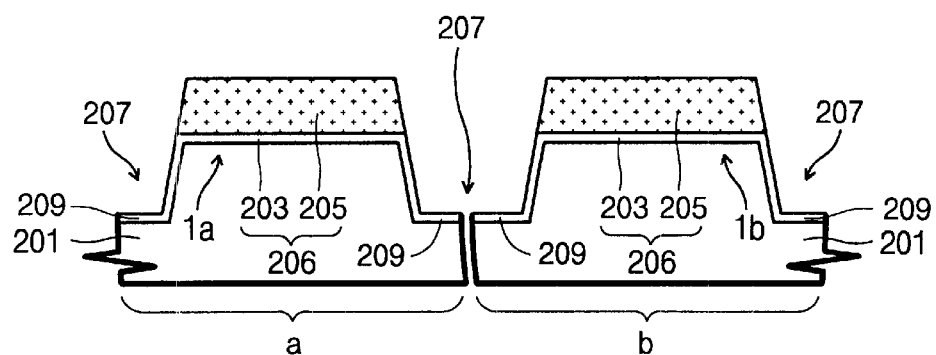
FIGS. 24–30, 31A and 31B are cross-sectional views for illustrating a method of fabricating a semiconductor device according to another embodiment of the present invention.

FIGS. 24–30, 31A and 31B are cross sectional views for illustrating a fabrication method of a semiconductor device according to another embodiment of the present invention. Referring to FIG. 24, a pad oxide layer and a pad nitride layer are sequentially formed on a semiconductor substrate 201, for example, a silicon substrate. The pad oxide layer is preferably formed to a thickness of 100 A to 200 A and the pad nitride layer is preferably formed to a thickness of 500 A to 1000 A. The pad nitride layer and the pad oxide layer are sequentially patterned to form at least one pad pattern 206 in the high voltage transistor region a and in the cell array region b respectively. The pad pattern 206 comprises a pad oxide layer pattern 203 and a pad nitride layer pattern 205, which are sequentially stacked. The substrate 201 is etched using the pad patterns 206 as etching masks, to thereby form an isolation region 207, e.g., a trench region defining a first active region 1a in the high voltage transistor region a and a second active region 1b in the cell array region b. A thermal oxidation process is carried out on the substrate including the trench region, thereby forming a thermal oxide layer 209 at the sidewall and bottom of the trench region.

Figure 25:
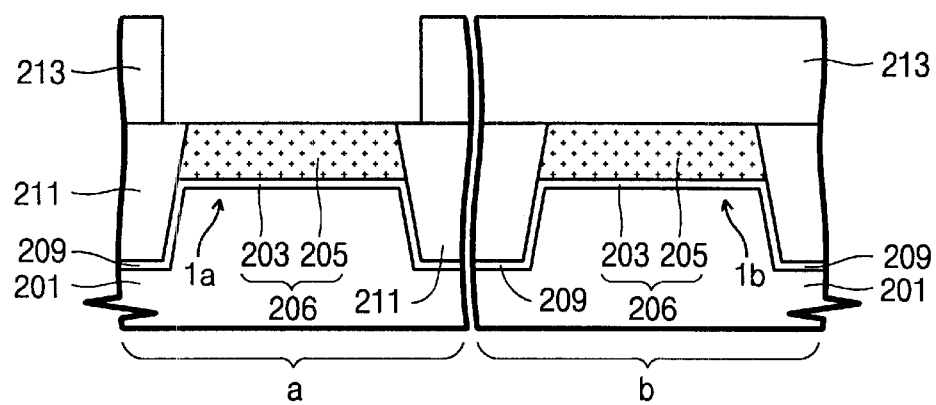

Referring to FIG. 25, an insulating layer filling the trench region is formed on the entire surface of the substrate including the trench region. The insulating layer may be formed in the same manner as the first embodiment of the present invention as described in connection with FIG. 20. The insulating layer is then planarized until the pad nitride layer patterns 205 are exposed, to thereby form an insulating layer pattern 211 in the isolation region 207. The planarization process is preferably performed using a CMP process. A first photoresist pattern 213 selectively exposing the pad nitride layer pattern 205 in the high voltage transistor region a is formed on the substrate including the insulating layer pattern 211.

Figure 26:
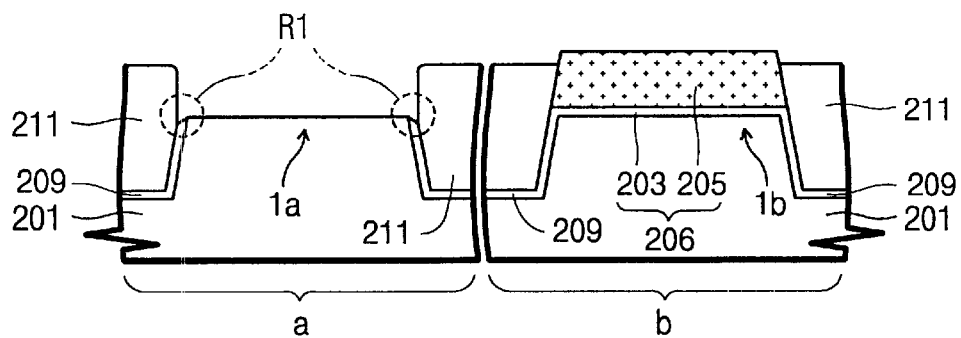

Referring to FIG. 26, the pad nitride layer pattern 205 exposed by the first photoresist pattern 213 is removed using a wet etchant such as phosphoric acid ($H_3PO_4$). The first photoresist pattern 213 is then removed. Subsequently, the pad oxide layer pattern 203 in the high voltage transistor region a is removed using an oxide etchant such as hydrofluoric acid (HF) or buffered oxide etchant (BOE), thereby exposing the first active region 1a. At this time, a portion of the insulating layer pattern 211 is etched. Thus, the top surface of the insulating layer pattern 211 is lowered and a first recessed region R1 may be formed at the edge of the first active region 1a. However, the first recessed region R1 is formed to a shallow depth, since the wet etching process for removing the thin pad oxide layer pattern 203 does not take long time.

Figure 27:
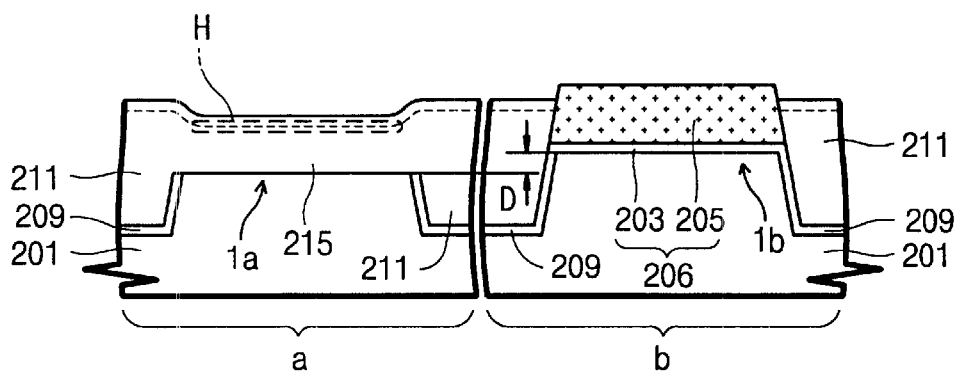

Referring to FIG. 27, a thermal oxidation process is applied to the resultant structure where the first active region 1a is exposed, thereby forming a first gate insulating layer 215 at the surface of the first active region 1a. The first gate insulating layer 215 is preferably formed to a thickness of 500 A or more, considering a subsequent recessing process. At this time, the bottom surface of the first gate insulating layer 215 becomes lower than the surface of the second active region 1b due to the own characteristic of the thermal oxidation process. For example, in case that the first gate insulating layer 215 is formed of a thermal oxide layer having a thickness of 500 A, a step difference D of about 200 A to 250 A is formed between the surfaces of the first and second active regions 1a and 1b. Here, it is most preferable that the step difference D is equal to a thickness difference between a first gate insulating layer to be finally remained in a subsequent process and a second gate insulating layer to be formed in a subsequent process. Thus, the first gate insulating layer 215 may be recessed additionally in order to reduce the step difference between the top surfaces of the first gate insulating layer 215 and the second active region 1b. At this time, it is preferable that the top surface H of the first gate insulating layer 215 remaining on the first active region 1a is still higher than the surface of the second active region 1b.

Figure 28:
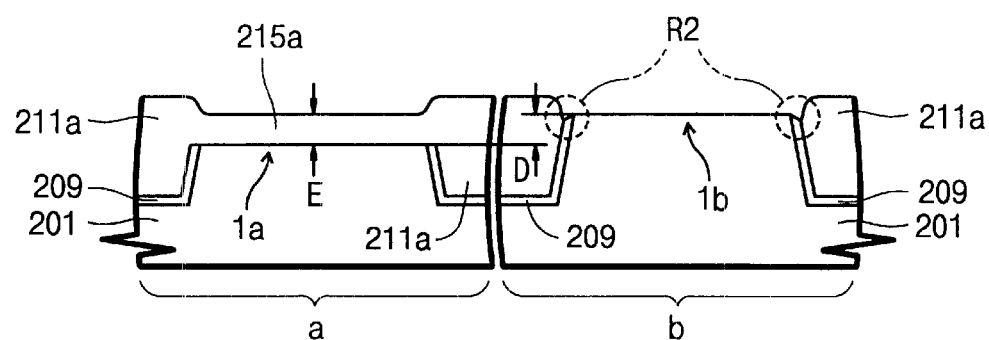

Referring to FIG. 28, the pad nitride layer pattern 205 and the pad oxide layer pattern 203 in the cell array 1b are removed to expose the second active region 1b. Therefore, a first gate insulating layer 215a having a desired thickness E is formed on the first active region 1a and an isolation layer 211a is formed in the trench region. It is preferable that the top surface of the first gate insulating layer 215a is still higher than the surface of the second active region 1b. At this time, a second recessed region R2 may be formed at the edge of the second active region 1b. Preferably, the depth of the second recessed region R2 is as shallow as possible.

Figure 29:
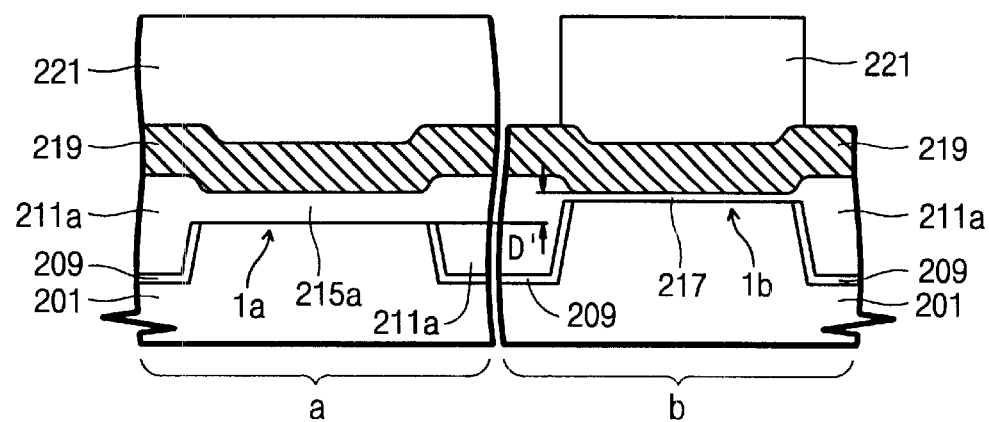

Referring to FIG. 29, a thermal oxidation process is applied to the resultant where the second active region 1b is exposed, thereby forming a second gate insulating layer 217, e.g., a thin tunnel oxide layer having a thickness of 80 A or less. At this time, a step difference D' between the top surfaces of the first active region 1a and the second gate insulating layer 217 is preferably equal to the thickness of the first gate insulating layer 215a. In other words, it is preferable that the top surface of the first gate insulating layer 215a has the same height as that of the second gate insulating layer 217.

A first conductive layer 219 is then formed on the entire surface of the substrate including the second gate insulating layer 217. The first conductive layer 219 is preferably formed of a doped polysilicon layer. A second photoresist pattern 221 covering the entire surface of the high voltage transistor region a and the second active region 1b is formed on the first conductive layer 219.

Figure 30:
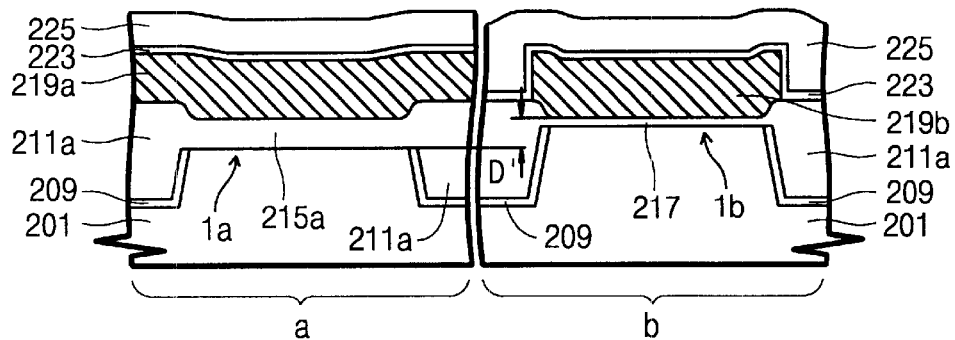
Figure 31A:
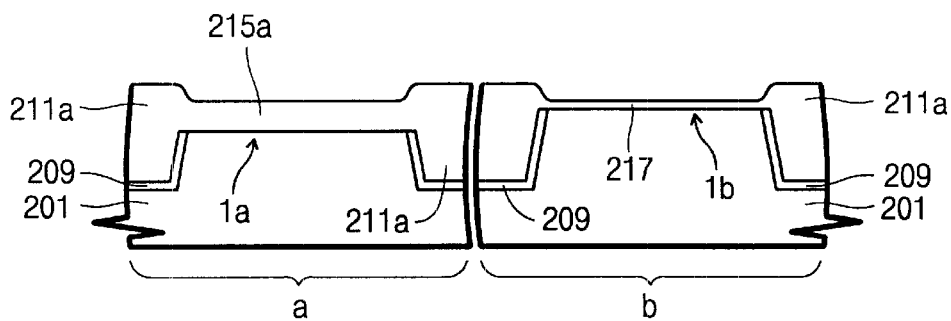
Figure 31B:
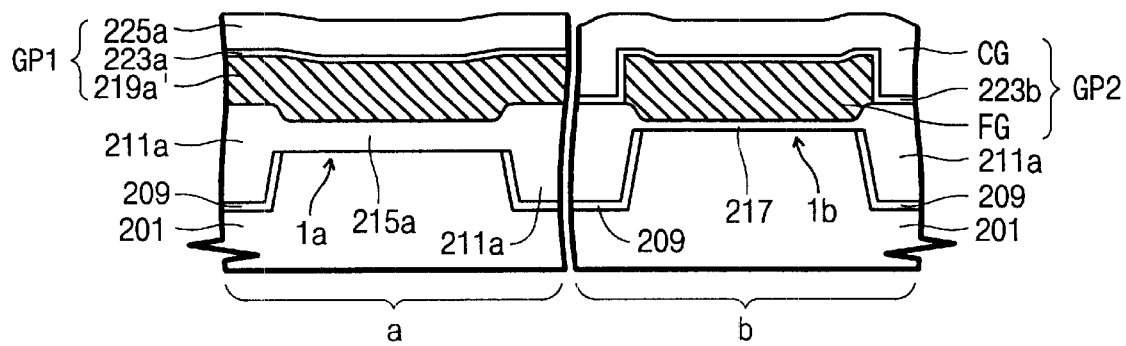

Referring to FIG. 30, the first conductive layer 219 is etched using the second photoresist pattern 221 as an etching mask, to thereby form a first conductive layer pattern 219a covering the high voltage transistor region a and a first conductive layer pattern 219b covering the second active region 1b. The second photoresist pattern 221 is then removed.

In the meantime, in case that the cell array region b corresponds to the low voltage transistor region in peripheral circuit region, there is no need to form the second photoresist pattern 221. In other words, the second photoresist pattern 221 is required in case of forming the floating gate FG of non-volatile memory device as shown in FIGS. 1 and 32.

An inter-gate dielectric layer 223 and a second conductive layer 225 are sequentially formed on the entire surface of the resultant structure where the second photoresist pattern 221 is removed. The inter-gate dielectric layer 223 is formed of the same material layer as the inter-gate dielectric layer 129 of the first embodiment of the present invention. Also, the second conductive layer 225 is formed of the same material layer as the third conductive layer 131 of the first embodiment of the present invention.

Referring to FIGS. 31A and 31B, the second conductive layer 225, the inter-gate dielectric layer 223 and the first conductive layer patters 219a and 219b are successively patterned, thereby forming a first and second gate patterns GP1 and GP2 crossing over the first and second active regions 1a and 1b respectively. The first gate pattern GP1 comprises a first gate electrode 219a', a first inter-gate dielectric layer 223a and a first dummy gate electrode 225a which are sequentially stacked. Similarly, the second gate pattern GP2 comprises a floating gate FG, a second inter-gate dielectric layer 223b and a control gate electrode CG which are sequentially stacked.

Furthermore, though not shown in the figure, in the event that the cell array region b corresponds to the low voltage transistor region, the second gate pattern GP2 has the same structure as the first gate pattern GP1. That is to say, the second gate pattern GP2 to be formed in the low voltage transistor may comprise a second gate electrode, a second inter-gate dielectric layer and a second dummy gate electrode which are sequentially stacked.

According to the second embodiment of the present invention, even though the step difference between the top surfaces of the first and second gate insulating layers 215a and 217, a stringer is not formed between the adjacent floating gates FG as shown in FIG. 31A. This is because the first patterning process for forming the floating gate FG is performed after forming the trench isolation causing the sloped sidewall. Also, it is unnecessary to accurately control the recessing process of the insulating layer pattern in order to form the isolation layer.

As described above, according to the present invention, the step difference between the top surfaces of the first and second gate insulating layers can be minimized. Thus, it is possible to increase the recessing process margin of the insulating layer pattern for forming the isolation layer in fabricating the non-volatile memory device adopting the self-aligned trench isolation technique. Also, it can prevent the stringer from being formed at the edge of the active region between the adjacent gate patterns.

In addition, according to the present invention, after forming the isolation layer defining the first and second active regions, the gate insulating layer for the high voltage transistor and the tunnel oxide layer for the cell transistor are respectively formed on the first and second active regions without using the photoresist layer. Accordingly, it can prevent the gate insulating layers from being contaminated with the photoresist layer. Also, it can solve the process failures due to the thinning effect of the gate insulating layers as well as the occurrence of stringer.

While this invention has been particularly shown and described with references to preferred embodiments thereof, it will be understood by those skilled in the art that various changes in form and detail may be made therein without departing from the spirit and scope of the invention as defined by the appended claims.

What is claimed is:

1. A method of fabricating semiconductor device, comprising:

forming a plurality of pad patterns on a semiconductor substrate;

etching the semiconductor substrate using the plurality of pad patterns as etching masks to form a trench region defining at least one first active region and at least one second active region;

forming an insulating layer pattern filling the trench region;

selectively removing the pad pattern on the first active region to expose the first active region;

forming a first gate insulating layer having a bottom surface which is lower than a top surface of the second active region at a surface of the first active region, wherein the step of forming the first gate insulating layer comprises:

thermally oxidizing the surface of the first active region to form a thermal oxide layer having a first thickness, and wet-etching the thermal oxide layer having the first thickness to form a thermal oxide layer having a second thickness which is less than the first thickness;

removing the pad pattern on the second active region to selectively expose the second active region; and forming a second gate insulating layer having a thickness which is thinner than that of the first gate insulating layer and having a top surface which is higher than the bottom surface of the first gate insulating layer.

2. The method of claim 1, wherein the first gate insulating layer is formed by thermally oxidizing the surface of the exposed first active region.

3. The method of claim 1, wherein the second gate insulating layer is formed by thermally oxidizing the surface of the exposed second active region.

4. The method of claim 1, further comprising:

forming a first gate pattern crossing over the first active region on a predetermined region of the first gate insulating layer; and forming a second gate pattern crossing over the second active region on a predetermined region of the second gate insulating layer.

5. The method of claim 4, wherein the steps of forming the first and second gate patterns comprise:

sequentially forming a first conductive layer, an inter-gate dielectric layer and a second conductive layer on an entire surface of the resultant structure where the first and second gate insulating layers are formed; and successively patterning the second conductive layer, the inter-gate dielectric layer and the first conductive layer, to thereby form a first gate electrode, a first inter-gate dielectric layer and a first dummy gate electrode which are sequentially stacked on a predetermined region of the first gate insulating layer and concurrently form a second gate electrode, a second inter-gate dielectric layer and a second dummy gate electrode which are sequentially stacked on a predetermined region of the second gate insulating layer.

6. The method of claim 4, wherein the steps of forming the first and second gate patterns comprise:

forming a first conductive layer on an entire surface of the resultant structure where the first and second gate insulating layers are formed;

patterning the first conductive layer to form a first conductive layer pattern exposing the insulating layer pattern adjacent to the second active region;

sequentially forming an inter-gate dielectric layer and a second conductive layer on an entire surface of the resultant structure where the first conductive layer pattern is formed; and successively patterning the second conductive layer, the inter-gate dielectric layer and the first conductive layer pattern, to thereby form a first gate electrode, a first inter-gate dielectric layer and a first dummy gate electrode which are sequentially stacked on a predetermined region of the first gate insulating layer and concurrently form a floating gate, a second inter-gate dielectric layer and a control gate electrode which are sequentially stacked on a predetermined region of the second gate insulating layer.

* * * * *